(12) United States Patent
Lee (10) Patent No.: US 11,955,386 B2
(45) Date of Patent: Apr. 9, 2024

(54) METHOD FOR EVALUATING DEFECTIVE REGION OF WAFER

(71) Applicant: SK SILTRON CO., LTD., Gumi-si (KR)

(72) Inventor: Jae Hyeong Lee, Gumi-si (KR)

(73) Assignee: SK Siltron Co., Ltd., Gumi-si (KR)

( * ) Notice: Subject to any disclaimer, the term of this patent is extended or adjusted under 35 U.S.C. 154(b) by 552 days.

(21) Appl. No.: 17/267,566

(22) PCT Filed: Dec. 27, 2018

(86) PCT No.: PCT/KR2018/016723
§ 371 (c)(1),
(2) Date: Feb. 10, 2021

(87) PCT Pub. No.: WO2020/040364
PCT Pub. Date: Feb. 27, 2020

(65) Prior Publication Data
US 2021/0320037 A1    Oct. 14, 2021

(30) Foreign Application Priority Data
Aug. 20, 2018 (KR) .................. 10-2018-0096559

(51) Int. Cl.
*H01L 21/66* (2006.01)
*G01N 21/88* (2006.01)
(Continued)

(52) U.S. Cl.
CPC ......... *H01L 22/12* (2013.01); *G01N 21/8851* (2013.01); *G01N 21/9501* (2013.01); *G01N 21/956* (2013.01)

(58) Field of Classification Search
None
See application file for complete search history.

(56) References Cited

U.S. PATENT DOCUMENTS

2012/0186607 A1    7/2012  Higashijima et al.
2019/0170661 A1*   6/2019  Lee ................... H01L 21/31116

FOREIGN PATENT DOCUMENTS

CN          1797215      7/2006
CN          101187065    5/2008
(Continued)

OTHER PUBLICATIONS

Japanese Office Action dated Apr. 6, 2022 issued in Application No. 2021-507977.
(Continued)

*Primary Examiner* — Hsien Ming Lee
(74) *Attorney, Agent, or Firm* — KED & Associates LLP (57) ABSTRACT

This embodiment comprises: a step for preparing a sample wafer; a step for forming a first oxide film on the sample wafer at a temperature of 700-800° C.; a step for forming a second oxide film on the first oxide film at a temperature of 800-1000° C.; a step for forming a third oxide film on the second oxide film at a temperature of 1000-1100° C.; a step for forming a fourth oxide film on the third oxide film at a temperature of 1100-1200° C.; a step for removing the first to fourth oxide films; a step for forming a haze on the surface of the sample wafer by etching the sample wafer from which the first to fourth oxide films have been removed; and a step for evaluating a defective region of the sample wafer on the basis of the haze.

10 Claims, 9 Drawing Sheets

(51) Int. Cl.
    *G01N 21/95*       (2006.01)
    *G01N 21/956*     (2006.01)

(56)             References Cited

FOREIGN PATENT DOCUMENTS

| | | | | |
|---|---|---|---|---|
| JP | 2003-229392 | | 8/2003 | |
| JP | 2008-085333 | | 4/2008 | |
| JP | 2014-518196 | | 7/2014 | |
| JP | 2015-154065 | * | 8/2015 | ............ H01L 21/66 |
| JP | 2017-220587 | | 12/2017 | |
| JP | 2018-093205 | | 6/2018 | |
| KR | 10-2008-0027554 | | 3/2008 | |
| KR | 10-2017-0004209 | | 1/2017 | |
| KR | 10-2018-0083326 | | 7/2018 | |

OTHER PUBLICATIONS International Search Report dated May 20, 2019 issued in Application No. PCT/KR2018/016723.
Chinese Office Action dated Jul. 1, 2023 issued in Application No. 201880096768.X.

* cited by examiner

FIG.2

| Step | Temperature Range(°C) | Hold time (hours) | THICKNESS(nm) | Remark |
|---|---|---|---|---|
| S120 | 700-800 | 1-3 | 4-7 | Nucleation#1 |
| S130 | 850-900 | 1-4 | 16-35 | Nucleation#2 |
| S140 | 950-1050 | 1-3 | 66-116 | Growth/ Haze Formation |
| S150 | 1100-1200 | 1-2 | 870-1150 | Interstitial Injection |

| STEP | CASE1 | CASE2 |
|---|---|---|
| S120 | SKIP | APPLIED |
| S130 | APPLIED | APPLIED |
| S140 | APPLIED | APPLIED |
| S150 | APPLIED | APPLIED |
| DIFFERENCE | VDP / IDP | VDP / IDP / B-band / IDP |

METHOD FOR EVALUATING DEFECTIVE REGION OF WAFER

CROSS-REFERENCE TO RELATED PATENT APPLICATIONS

This application is a U.S. National Stage Application under 35 U.S.C. § 371 of PCT Application No. PCT/KR2018/016723, filed Dec. 27, 2018, which claims priority to Korean Patent Application No. 10-2018-0096559, filed Aug. 20, 2018, whose entire disclosures are hereby incorporated by reference.

TECHNICAL FIELD

Embodiments relate to a method of evaluating a defect region of a silicon wafer.

BACKGROUND ART

In single crystal silicon manufactured by a CZ method, the following crystal defect region may be generated depending to the concentration of a point defect mixed in a growth process according to Voronkov Theory related to pulling speed (V)/temperature gradient (G).

For example, in the case of high-speed growth in which the single crystal silicon grows to a critical value of V/G or more, a V-rich region having a void defect may be generated.

In addition, for example, in the case in which the single crystal silicon grows to the critical value of V/G or more but grows at a lower speed than the V-rich region, an O-band in which an oxidation-induced stacking fault (OISF) is generated at the edge or central region thereof in a ring shape may be generated.

In addition, for example, in the case of low-speed growth in which the single crystal silicon grows to the critical value of V/G or less, an I-rich region in which a large dislocation pit (LDP) defect region due to mutual pinning of a dislocation loop is spontaneously generated may appear.

A defect-free region having no point defect cohesion may be present between the V-rich region and the I-rich region.

The defect-free region may be divided into a vacancy dominant pure (VDP) region, in which vacancy is dominant, and an interstitial dominant pure (IDP) region, in which self-interstitial is dominant, depending on the attributes of a point defect.

A grown-in defect, such as crystal originated particles (COP) and LDP, in CZ-Si is directly related to device failure, such as current leakage or oxide breakdown. Consequently, it is preferable that a wafer including a region having a high grown-in defect generation frequency be excluded from a growth process.

In addition, a difference in oxygen precipitation due to a mixture of the VDP defect region and the IDP defect region leads to a difference in gettering ability with respect to metal contamination in a wafer, whereby it is possible to prevent device failure due to metal contamination. However, a problem, such as lowering of wafer strength, may occur as the result of a decrease in a denuded zone (DZ) or a decrease in residual oxygen amount (residual Oi) due to excessive oxygen precipitation.

Consequently, it is preferable to control a grown-in defect generation region, to grasp in advance point defect distribution in a defect-free region in a crystal growth step, and to accurately recognize borders between the O-band, the VDP region, and the IDP region.

In particular, at the present time, at which a COP-free wafer is commercialized, an evaluation method capable of recognizing all borders of the defect-free region including the O-band as well as the VDP and the IDP is being developed.

DISCLOSURE

Technical Problem

Embodiments provide a wafer defect region evaluation method capable of rapidly and easily discriminating between O-band, VDP, IDP, and B-band of a COP-free wafer.

Technical Solution

A wafer defect region evaluation method according to an embodiment includes preparing a sample wafer, forming a first oxide film on the sample wafer at a temperature of 700° C. to 800° C., forming a second oxide film on the first oxide film at a temperature of 800° C. to 1000° C., forming a third oxide film on the second oxide film at a temperature of 1000° C. to 1100° C., forming a fourth oxide film on the third oxide film at a temperature of 1100° C. to 1200° C., removing the first to fourth oxide films, etching the sample wafer, from which the first to fourth oxide films are removed, to form haze on the surface of the sample wafer, and evaluating a defect region of the sample wafer based on the haze.

The first oxide film, the second oxide film, and the third oxide film may be formed by a dry oxidation process, and the fourth oxide film may be formed by a wet oxidation process.

The thickness of the second oxide film may be greater than the thickness of the first oxide film, and the thickness of the fourth oxide film may be greater than the thickness of each of the first to third oxide films.

A wafer defect region evaluation method according to another embodiment includes a step of preparing a sample wafer, a step including a first temperature increase period of increasing temperature to a first target temperature and a first temperature maintenance period of maintaining the first target temperature, wherein a first oxide film is formed on the sample wafer using a dry oxidation process in the first temperature maintenance period, a step including a second temperature increase period of increasing temperature from the first target temperature to a second target temperature and a second temperature maintenance period of maintaining the second target temperature, wherein a second oxide film is formed on the first oxide film using a dry oxidation process in the second temperature increase period and the second temperature maintenance period, a step including a third temperature increase period of increasing temperature from the second target temperature to a third target temperature and a third temperature maintenance period of maintaining the third target temperature, wherein a third oxide film is formed on the second oxide film using a dry oxidation process in the third temperature increase period and the third temperature maintenance period, a step including a fourth temperature increase period of increasing temperature from the third target temperature to a fourth target temperature and a fourth temperature maintenance period of maintaining the fourth target temperature, wherein a fourth oxide film is formed on the third oxide film using a wet oxidation process in the fourth temperature maintenance period, a step of removing the first to fourth oxide films, a step of etching the sample wafer, from which the first to fourth oxide films are removed, to form haze on the surface of the sample wafer, and a step of evaluating a defect region of the sample wafer based on the haze.

The first target temperature may be 750° C. to 800° C., the second target temperature may be 850° C. to 900° C., the third target temperature may be 950° C. to 1050° C., and the fourth target temperature may be 1100° C. to 1200° C.

Each of the temperature increase gradient of the third temperature increase period and the temperature increase gradient of the fourth temperature increase period may be 4 [° C./min] to 6 [° C./min].

The wafer defect region evaluation method may further include a cooling process of decreasing temperature from the fourth target temperature to a fifth target temperature between the step of forming the fourth oxide film and the step of removing the first to fourth oxide films.

The fifth target temperature may be 750° C. to 850° C.

The temperature decrease gradient in the cooling process may be 3 [° C./min] to 10 [° C./min].

The haze may include at least one of a white region and a black region, and the step of evaluating the defect region of the sample wafer may include imparting a score depending on the area of the white region or the area of the black region of the sample wafer and evaluating the defect region of the sample wafer based on the imparted score.

Advantageous Effects

According to embodiments, it is possible to evaluate a wafer defect region by rapidly and easily discriminating between O-band, VDP, IDP, and B-band of a COP-free wafer.

BEST MODE

Hereinafter, embodiments capable of concretely accomplishing the above object will be described with reference to the accompanying drawings.

In the following description of the embodiments, it will be understood that, when each element is referred to as being "on" or "under" another element, it can be "directly" on or under another element, or can be "indirectly" disposed in relation thereto such that an intervening element is present therebetween. In addition, when an element is referred to as being "on" or "under," "under the element" as well as "on the element" can be included based on the element.

In addition, relational terms, such as "first," "second," "on/upper portion/above," and "under/lower portion/below," are used only to distinguish between one subject or element and another subject or element without necessarily requiring or involving any physical or logical relationship or sequence between such subjects or elements. In addition, wherever possible, the same reference numbers will be used throughout the drawings to refer to the same or like parts.

In addition, the terms "include," "comprise" and "have" mean that elements can be inherent unless otherwise stated. Therefore, the terms should be interpreted not to exclude other elements but to further include such other elements. In addition, the term "corresponding" may mean at least one of "opposite" or "overlapping."

Figure 1:
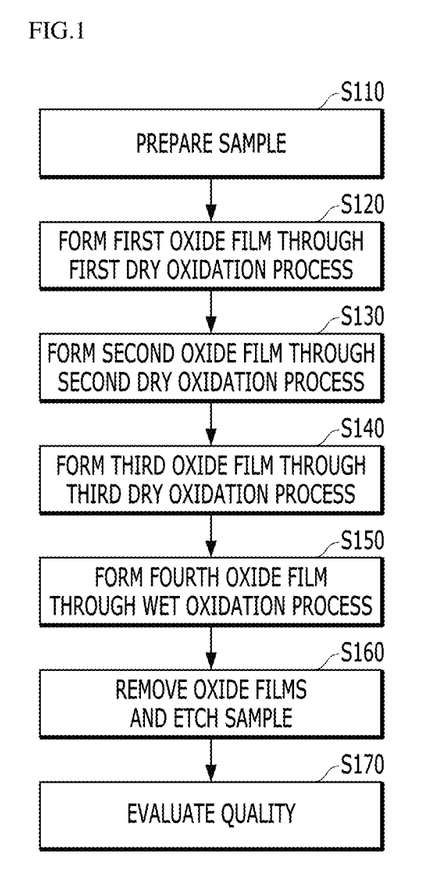
FIG. 1 is a flowchart of a wafer defect region evaluation method according to an embodiment.

FIG. 1 is a flowchart of a wafer defect region evaluation method according to an embodiment.

Referring to FIG. 1, the wafer defect region evaluation method may include a step (S110) of preparing a wafer sample, a step (S120) of forming a first oxide film through a first dry oxidation process, a step (S130) of forming a second oxide film through a second dry oxidation process, a step (S140) of forming a third oxide film through a third dry oxidation process, a step (S150) of forming a fourth oxide film through a wet oxidation process, a step (S160) of removing the oxide films and performing an etching process, and an evaluation step (S170).

First, a wafer sample is prepared (S110).

The prepared wafer sample may be a semiconductor wafer obtained by growing a silicon single crystal ingot and performing ingot grinding, cropping, and slicing processes with respect to the grown single crystal ingot.

Alternatively, the prepared wafer may be obtained by performing at least one of lapping, grinding, etching, and polishing processes with respect to the surface of the semiconductor wafer.

Subsequently, a first dry oxidation process is performed with respect to the sample wafer to form a first oxide film on the sample wafer (S120).

In the first dry oxidation process, oxygen gas (O2) may be injected into a reactor (or a chamber) at a temperature of 700° C. to 800° C., and the first oxide film may be formed on the surface of the sample wafer using the injected oxygen gas.

For example, the thickness of the first oxide film may be 4 nm to 7 nm.

In the first dry oxidation process, formation of a precipitation nucleus may be increased to the maximum in a region rich in interstitial Si, and this may act as a source capable of inhibiting generation of haze in a heat treatment process following the subsequent oxidation processes (S130 to S150).

Subsequently, in a second dry oxidation process, oxygen gas (O2) is injected into the reactor (or the chamber) at a temperature of 800° C. to 1000° C., and a second oxide film is formed on the first oxide film of the sample wafer using the injected oxygen gas (S130).

In addition, the thickness of the second oxide film may be greater than the thickness of the first oxide film.

The thickness of the second oxide film may be 7.8 nm to 35 nm. For example, the thickness of the second oxide film may be 16 nm to 35 nm.

In the second dry oxidation process, a self-interstitial may be supersaturated, and nucleation of oxygen precipitate may be performed. The self-interstitial supersaturated in a lowtemperature oxidation process may be changed to a dislocation type defect in a high-temperature process.

In addition, the oxygen precipitate may serve as a sink of the self-interstitial supersaturated at the interface of an oxide substrate after single crystal growth. As a result, it is possible to recognize a point defect region in which the difference in oxygen precipitation force is reflected in whether an interstitial defect is formed.

Subsequently, in a third dry oxidation process, oxygen gas (O2) is injected into the reactor (or the chamber) at a temperature of 1000° C. to 1100° C., and a third oxide film is formed on the second oxide film of the sample wafer using the injected oxygen gas (S140).

Third dry oxidation process time may be longer than second dry oxidation process time. However, embodiments are not limited thereto.

In addition, the thickness of the third oxide film may be greater than the thickness of the second oxide film. However, embodiments are not limited thereto.

The thickness of the third oxide film may be 27 nm to 160 nm. For example, the thickness of the third oxide film may be 66 nm to 116 nm.

The third dry oxidation process may be a process in which the oxygen precipitate grows and the oxygen precipitate grown through diffusion of the self-interstitial is recombined.

In the third dry oxidation process, the oxygen precipitate acts as a recombination site of the self-interstitial. In the third dry oxidation process, therefore, it is possible to recognize the border between O-band/VDP, in which oxygen precipitation is active, and interstitial dominant pure (IDP).

In addition, the size of the oxygen precipitate must be sufficiently increased in order to provide a recombination site for the self-interstitial. Consequently, the third dry oxidation process may be longer than the second dry oxidation process. However, embodiments are not limited thereto. In another embodiment, both may be equal to each other, or the third dry oxidation process may be shorter than the second dry oxidation process.

The flow rate (or the input amount) of oxygen gas in the third dry oxidation process may be equal to the flow rate (or the input amount) of oxygen gas in the second dry oxidation process. However, embodiments are not limited thereto.

Subsequently, a wet oxidation process is performed to form a fourth oxide film on the third oxide film (S150).

That is, oxygen gas (O2) and hydrogen gas (H2) may be injected into the reactor (or the chamber) at a temperature of 1100° C. to 1200° C., and a fourth oxide film may be formed on the third oxide film of the sample wafer using the injected oxygen gas and hydrogen gas.

The thickness of the fourth oxide film may be greater than the thickness of the third oxide film.

The thickness of the fourth oxide film may be greater than the sum of the thicknesses of the first to third oxide films.

The thickness of the fourth oxide film may be 650 nm to 1260 nm.

For example, the thickness of the fourth oxide film may be 870 nm to 1150 nm.

The process time of the wet oxidation process may be shorter than the process time of the second dry oxidation process, and may be shorter than the process time of the third dry oxidation process.

The flow rate of oxygen gas in the wet oxidation process may be equal to the flow rate of oxygen gas in each of the second dry oxidation process and the third dry oxidation process.

In addition, the flow rate of hydrogen gas in the wet oxidation process may be greater than the flow rate of oxygen gas in the wet oxidation process. For example, the flow rate of hydrogen gas in the wet oxidation process may be 1 [SLM] to 6 [SLM], and the flow rate of hydrogen gas may be 1 [SLM] to 4 [SLM].

In the wet oxidation process (S150), the supersaturated self-interstitial remaining without being recombined in the second dry oxidation process (S130) and the third dry oxidation process (S140) may be converted into a dislocation type defect. However, embodiments are not limited thereto.

The defect formed in the wet oxidation process may act as surface haze in a subsequent etching step (S160), whereby visual analysis is possible.

Figure 2:
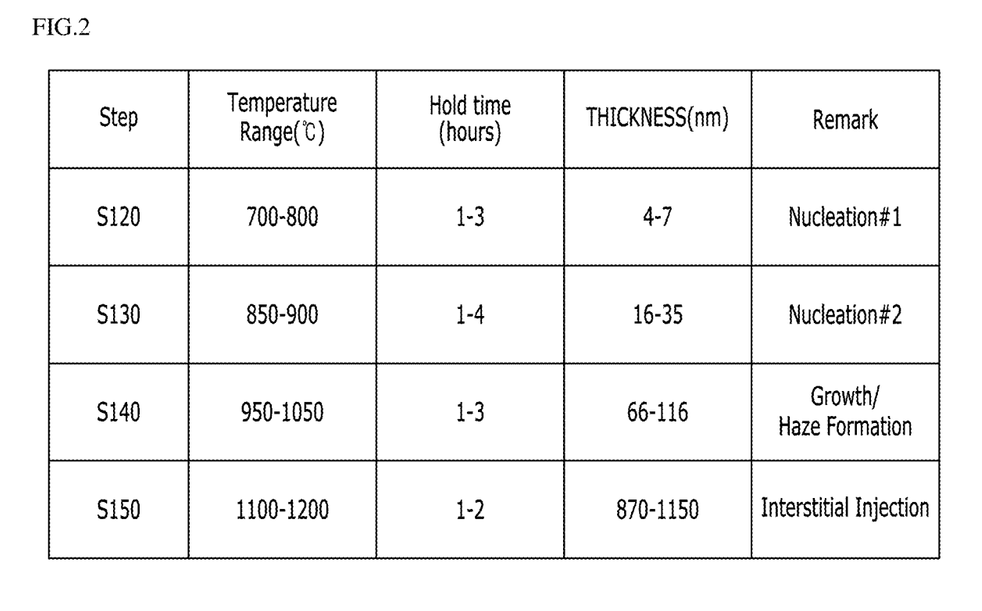
FIG. 2 shows process conditions for a first dry oxidation process, a second dry oxidation process, a third dry oxidation process, and a wet oxidation process according to another embodiment.

FIG. 2 shows process conditions for a first dry oxidation process (S120), a second dry oxidation process (S130), a third dry oxidation process (S140), and a wet oxidation process (S150) according to another embodiment.

Referring to FIG. 2, temperature of the first dry oxidation process (S120) may be 700° C. to 800° C., and process time thereof may be 1 hour to 3 hours. The thickness of a first oxide film that is formed may be 4 nm to 7 nm.

Temperature of the second dry oxidation process (S130) may be 850° C. to 900° C., and process time thereof may be 1 hour to 4 hours. The thickness of a second oxide film that is formed may be 16 nm to 35 nm.

In addition, temperature of the third dry oxidation process (S140) may be 950° C. to 1050° C., and process time thereof may be 1 hour to 3 hours. The thickness of a third oxide film may be 66 nm to 116 nm.

In addition, temperature of the wet oxidation process (S150) may be 1100° C. to 1200° C., and process time thereof may be 1 hour to 2 hours. The thickness of a fourth oxide film may be 870 nm to 1150 nm.

Figure 3:
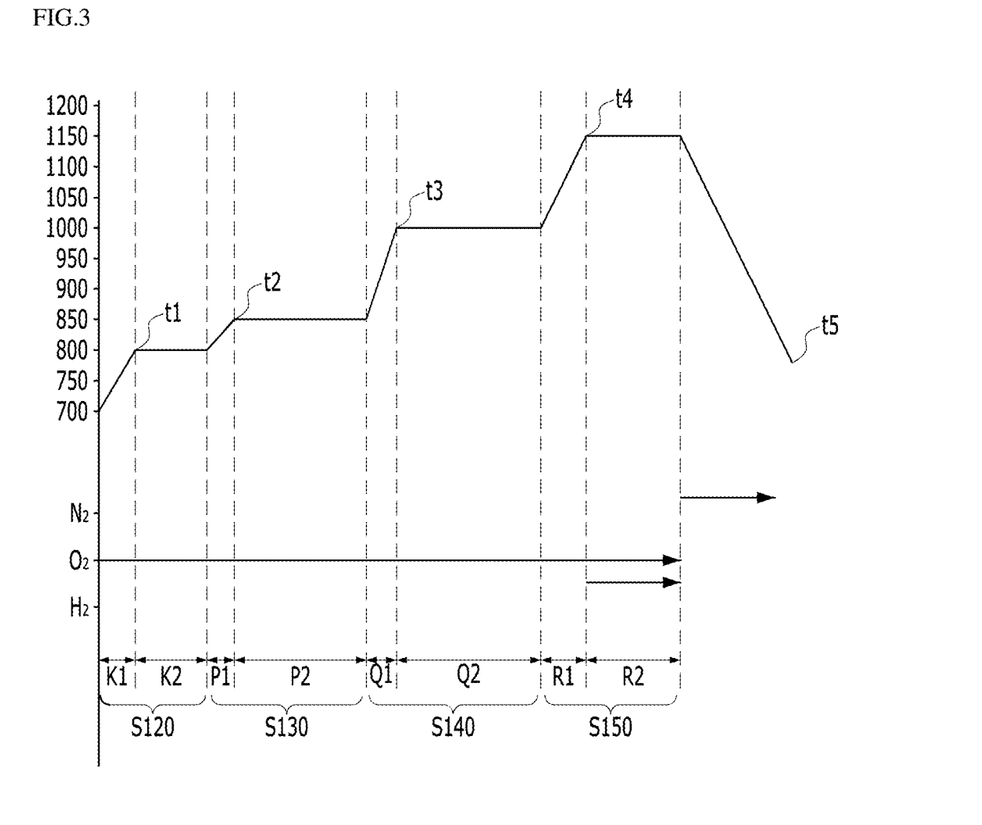
FIG. 3 is a graph showing process conditions for a first dry oxidation process, a second dry oxidation process, a third dry oxidation process, and a wet oxidation process according to a further embodiment.

FIG. 3 is a graph showing process conditions for a first dry oxidation process (S120), a second dry oxidation process (S130), a third dry oxidation process (S140), and a wet oxidation process (S150) according to a further embodiment.

In the graph, the x axis indicates process time, and the y axis indicates process temperature.

Referring to FIG. 3, the first dry oxidation process (S120) may include a first temperature increase period K1 and a first temperature maintenance period K2.

The first temperature increase period K1 may be a period in which temperature increases at a uniform gradient in the state in which no oxygen gas (O2) is injected.

In the first temperature maintenance period K2, process temperature may be maintained at a first target temperature t1, and oxygen gas (O2) may be provided to form a first oxide film.

In the first temperature increase period K1, temperature may increase from 700° C. to the first target temperature t1. For example, the first target temperature t1 may be 750° C. to 800° C. For example, the first target temperature t1 may be 800° C.

The second dry oxidation process (S130) may include a second temperature increase period P1 and a second temperature maintenance period P2.

The second temperature increase period P1 may be a period in which temperature increases from the first target temperature t1 to a second target temperature t2 at a uniform gradient.

In the second temperature increase period P1, temperature may increase from 800° C. to the second target temperature t2, and oxygen gas (O2) may be provided.

For example, the second target temperature t2 may be 850° C. to 900° C. For example, the second target temperature t2 may be 870° C.

In the second temperature maintenance period P2, process temperature may be maintained at the second target temperature t2, and oxygen gas (O2) may be provided.

In the second temperature increase period P1 and the second temperature maintenance period P2, a second oxide film may be formed.

The third dry oxidation process (S140) may include a third temperature increase period Q1 and a third temperature maintenance period Q2.

In the third temperature increase period Q1, temperature may increase from the second target temperature t2 to a third target temperature t3, and oxygen gas (O2) may be provided.

For example, the third target temperature t3 may be 950° C. to 1050° C. For example, the third target temperature t3 may be 1000° C.

The temperature increase gradient of the third temperature increase period Q1 may be 4 [° C./min] to 6 [° C./min]. For example, the temperature increase gradient of the third temperature increase period Q1 may be 5 [° C./min].

The process time of the second temperature increase period P1 may be shorter than the process time of the third temperature increase period Q1. In addition, the process time of the second temperature maintenance period P2 may be longer than each of the process time of the second temperature increase period P1 and the process time of the third temperature increase period Q1.

In the third temperature maintenance period Q2, process temperature may be maintained at the third target temperature t3, and oxygen gas (O2) may be provided.

In the third temperature increase period Q1 and the third temperature maintenance period Q2, a third oxide film may be formed.

The wet oxidation process (S150) may include a fourth temperature increase period R1 and a fourth temperature maintenance period R2.

In the fourth temperature increase period R1, temperature may increase from the third target temperature t3 to a fourth target temperature t4.

For example, the fourth target temperature t4 may be 1100° C. to 1200° C. For example, the fourth target temperature t4 may be 1150° C.

The temperature increase gradient of the fourth temperature increase period R1 may be 4 [° C./min] to 6 [° C./min]. For example, the temperature increase gradient of the fourth temperature increase period R1 may be 5 [° C./min].

The temperature increase gradient of the fourth temperature increase period R1 may be equal to the temperature increase gradient of the third temperature increase period Q1. However, embodiments are not limited thereto. In another embodiment, temperature increase gradient of the fourth temperature increase period R1 may be greater than the temperature increase gradient of the third temperature increase period Q1, and vice versa in a further embodiment.

In the fourth temperature maintenance period R2, process temperature may be maintained at the fourth target temperature t4, oxygen gas (O2) and hydrogen gas (H2) may be injected, and a fourth oxide film may be formed.

In another embodiment, oxygen gas (O2) and hydrogen gas (H2) may be provided and a fourth oxide film may be formed in the fourth temperature increase period R1 and the fourth temperature maintenance period R2.

For example, the process time of the second temperature maintenance period P2 may be shorter than the process time of the third temperature maintenance period Q2. In addition, the process time of the fourth temperature maintenance period R2 may be shorter than the process time of the second temperature maintenance period P2.

For example, the process time of the second temperature maintenance period P2 may be 110 minutes to 150 minutes.

For example, the process time of the third temperature maintenance period Q2 may be 160 minutes to 200 minutes.

For example, the process time of the fourth temperature maintenance period R2 may be 80 minutes to 100 minutes.

For example, the process time of the second temperature maintenance period P2 may be 120 minutes, the process time of the third temperature maintenance period Q2 may be 180 minutes, and the process time of the fourth temperature maintenance period R2 may be 100 minutes. However, embodiments are not limited thereto.

For example, the process time of the second temperature increase period P1 may be shorter than the process time of the third temperature increase period Q1, and the process time of the third temperature increase period Q1 may be equal to or shorter than the process time of the fourth temperature increase period R1.

The flow rates of oxygen gas supplied in the first temperature maintenance period K2, the second temperature maintenance period P2, the third temperature increase period Q1, the third temperature maintenance period Q2, the fourth temperature increase period R1, and the fourth temperature maintenance period R2 may be equal to each other. However, embodiments are not limited thereto. In another embodiment, the flow rate of oxygen gas supplied in at least one of the periods K2, P2, Q1, Q2, R1, and R2 may be different from the flow rates of oxygen gas supplied in the other periods.

In addition, the flow rate of hydrogen gas in the fourth temperature maintenance period R2 may be greater than the flow rates of oxygen gas in the periods K2, P2, Q1, Q2, R1, and R2. However, embodiments are not limited thereto. In another embodiment, the flow rate of hydrogen gas in the fourth temperature maintenance period R2 may be equal to or less than the flow rates of oxygen gas in the periods K2, P2, Q1, Q2, R1, and R2.

After the fourth oxide film is formed in the wet oxidation process, the first to fourth oxide films formed on the sample wafer are removed, and the sample water, from which the first to fourth oxide films are removed, is etched to form haze for evaluation on the surface of the wafer (S160).

For example, the first to fourth oxide films are removed from the sample wafer having the first to fourth oxide films formed thereon using a hydrofluoric acid solution. For example, the first to fourth oxide films may be removed through an HF stripping process.

After the wet oxidation process, a cooling process in which no oxidizing gas is injected, nitrogen gas is injected, and temperature is decreased from the fourth target temperature t4 may be performed.

For example, in the cooling process, temperature may be decreased from the fourth target temperature t4 to a fifth target temperature t5. At this time, the temperature decrease gradient may be 3 [° C./min] to 10 [° C./min]. For example, the temperature decrease gradient may be 3 [° C./min].

For example, the fifth target temperature t5 may be 750° C. to 850° C. For example, the fifth target temperature t5 may be 800° C.

As the result of etching the sample wafer, from which the first to fourth oxide films are removed, by wet etching, as described above, haze for evaluation of a point defect region may be formed on the surface of the sample wafer.

Subsequently, a crystal defect region and the quality of the sample wafer are evaluated with respect to the sample wafer having the haze marked thereon through haze scoring (S160).

For example, the haze may include at least one of a white region and a black region, and a score based on the area (or the width) of the white region, the area (or the width) of the black region, or the ratio between the area (or the width) of the white region and the area (or the width) of the black region may be applied to the sample wafer having the haze marked thereon.

For example, the white region may indicate a Pi region, and the black region may indicate a Pv region.

For example, scoring may be performed with respect to the Pi region of the white region or the Pv region of the black region.

For example, a score of 10 may be assigned to the white region or the black region in the unit of a length (for example, 10 mm) set in advance in a direction from the center of one surface of the wafer to the edge of the wafer. The score for the white region may be proportional to the breadth of the white region.

It is possible to recognize the width of the VDP and the width of the IDP of the sample wafer, to recognize a border region between the VDP and the IDP, and to recognize a B-band, which is a border region between the IDP and the LDP, based on the score assigned to the sample wafer.

Figure 4:
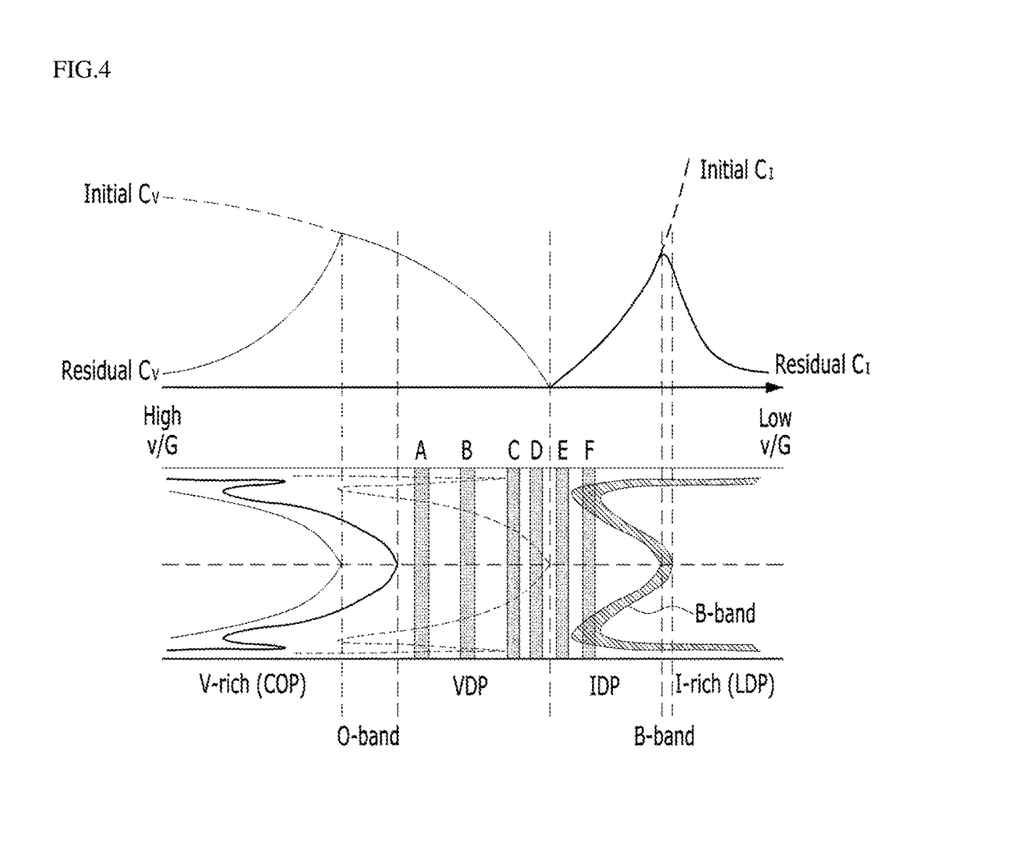
FIG. 4 shows defect distribution in a single crystal depending on the pulling speed of an ingot.

FIG. 4 shows defect distribution in a single crystal depending on the pulling speed of an ingot.

Referring to FIG. 4, there are shown various defect area distributions of a single crystal that can appear depending on the pulling speed of a single crystal ingot.

In the graph, initial Cv indicates the total concentration of initially introduced vacancy, residual Cv indicates the concentration of vacancy in a corresponding defect area, initial Ci indicates the total concentration of initially introduced interstitial silicon (interstitial Si), and residual Ci indicates the concentration of interstitial Si in a corresponding defect area.

For example, as the pulling speed of V/G of the single crystal ingot is greater than a critical value, an O-band region and a V-rich region may appear. In contrast, as the pulling speed of V/G of the single crystal ingot is less than the critical value, a B-band region and an LDP region may appear.

Here, the B-band region may be a defect area that appears between the IDP and the LDP in a CZ silicon single crystal. That is, the B-band region may be a region in which the introduced interstitial Si remains supersaturated in a single crystal growth process. The supersaturated Si may act as an oxygen precipitation nucleus, whereby the oxygen precipitation amount in the B-band may be greater than the oxygen precipitation amount in the IDP.

In the B-band region, oxygen precipitation is performed using the supersaturated Si as a precipitation nucleus. A denuded zone appears very shallow, and there is a high possibility of affecting device characteristics, rather than the IDP.

For example, the oxygen precipitation density of the O-band may be $7\times10^9/cm^3$, the oxygen precipitation density of the VDP may be $3\times10^9/cm^3$ to $7\times10^9/cm^3$, the oxygen precipitation density of the IDP may be less than $1\times10^8/cm^3$, the oxygen precipitation density of the B-band may be $1\times10^8/cm^3$ to $5\times10^8/cm^3$, and the oxygen precipitation density of the LDP may be $1\times10^8/cm^3$ to $5\times10^8/cm^3$.

Figure 5A:
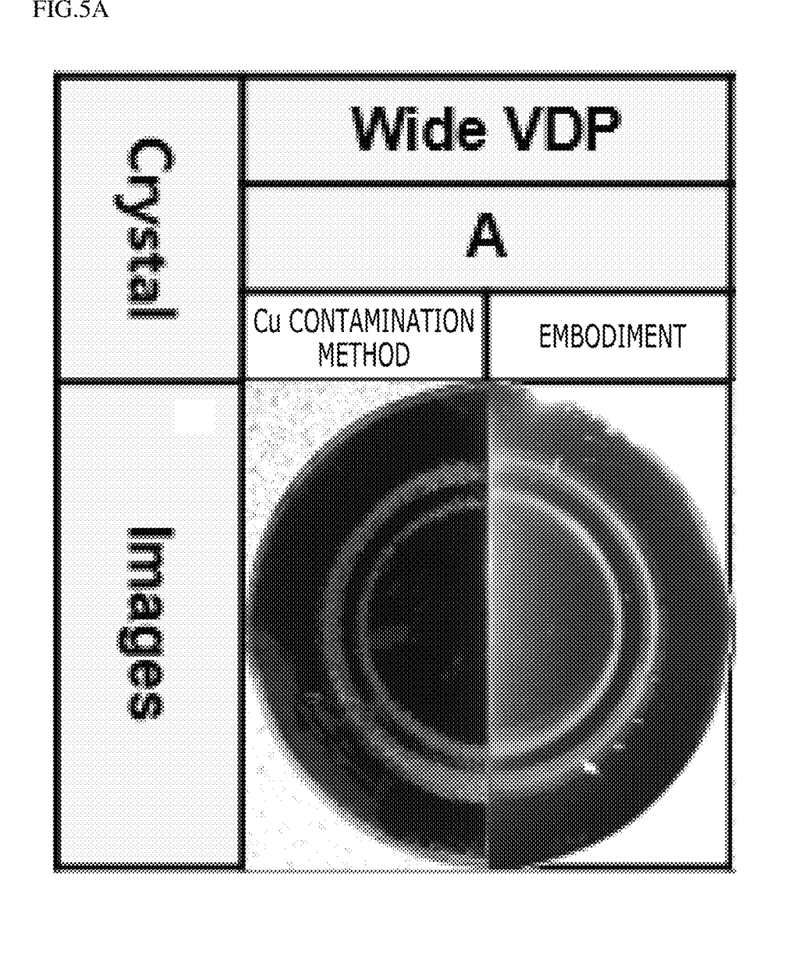
FIGS. 5A to 5C show parts A to F, shown in FIG. 4, of a sample wafer formed by a copper contamination method and a method according to an embodiment.
Figure 5B:
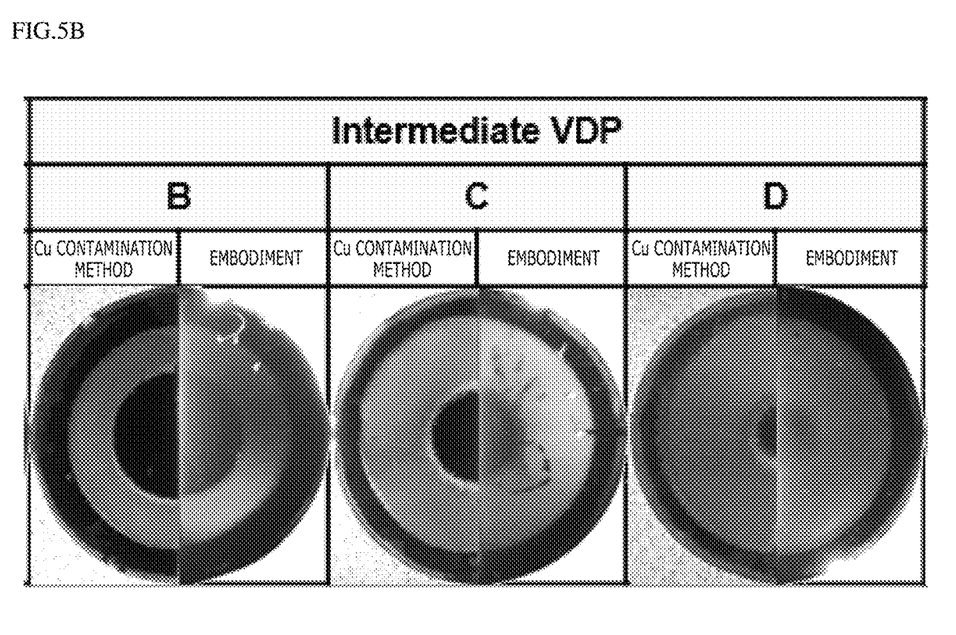
Figure 5C:
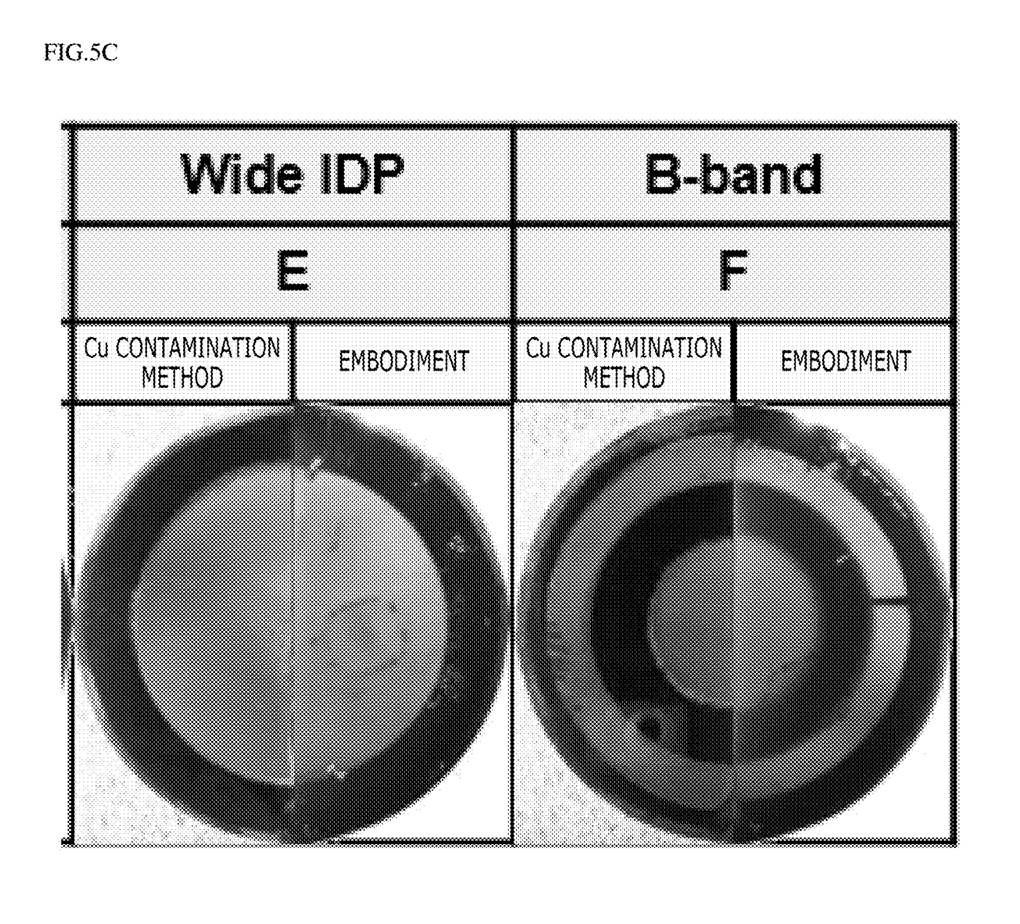

FIGS. 5A to 5C show parts A to F, shown in FIG. 4, of the sample wafer formed by a copper contamination method and a method according to an embodiment.

FIG. 5A shows part A of FIG. 4. Part a indicates a defect region of Wide VDP. FIG. 5B shows part B, part C, and part D of FIG. 4. Part B, part C, and part D indicate intermediate VDP.

FIG. 5C shows part E and part F of FIG. 4. Part E indicates Wide IDP, and part F indicates B-band.

Referring to FIGS. 5A to 5C, a copper contamination (Cu contamination) method and a method according to an embodiment may be applied to a single silicon wafer sample corresponding to parts A to F.

The border of a point defect region may be visualized in the form of a white region on a highlight according to the result of application of the copper contamination (Cu contamination) method and the method according to the embodiment. Here, the highlight may be observed in the form of haze in which, when high-intensity light is radiated onto one surface of a wafer exposed through etching, the light is scattered and glitters by a defect region, if any, and the point defect region may be visualized through the highlight.

Here, the VDP region may appear as a black region, and the IDP region may appear as a white region. In addition, the B-band region may appear as a black region.

As shown in FIGS. 5A to 5C, the white region and the black region visualized by the method according to the embodiment show forms similar to the white region and the black region visualized by the copper contamination (Cu contamination) method.

Consequently, evaluation of the defect region based on the haze acquired by the method according to the embodiment may have reliability equivalent to evaluation of the defect region based on the copper contamination (Cu contamination) method.

That is, nucleation of oxygen precipitates may be performed by the first and second dry oxidation processes, growth and recombination of the oxygen precipitates may be performed by the third dry oxidation process, conversion of supersaturated self-interstitial into a dislocation type defect by the wet oxidation process may be performed, haze enabling discrimination between VDP, IDP, and B-band may be formed on the surface of a wafer through the oxide film removal and etching processes, and the formed haze may have a form similar to a white region and a black region acquired by the copper contamination method. Consequently, it is possible to apply a method of scoring haze acquired by the conventional copper contamination method without change.

Figure 6:
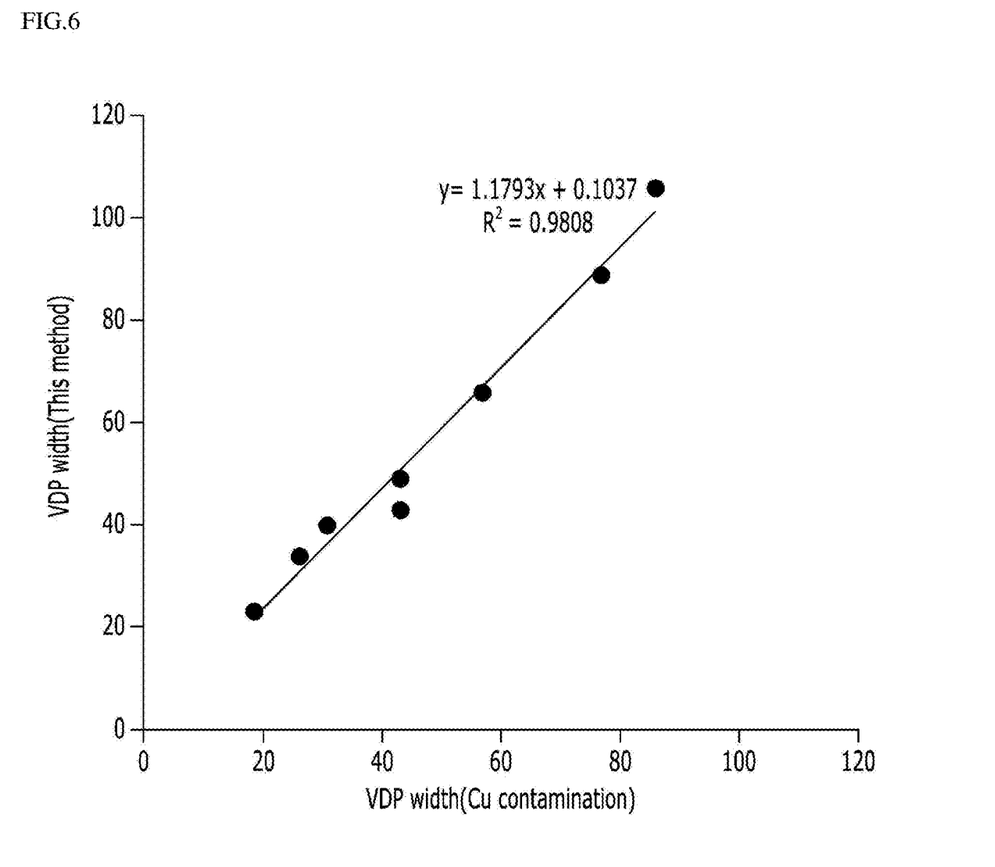
FIG. 6 shows a correlation between VDP widths measured by the copper contamination method and the method according to the embodiment in FIGS. 5A to 5C.

FIG. 6 shows a correlation between VDP widths measured by the copper contamination method and the method according to the embodiment in FIGS. 5A to 5C.

Referring to FIG. 6, it can be seen there is a high correlation between the width of VDP acquired by the copper contamination method and the width of VDP acquired by the method according to the embodiment.

In FIG. 6, a linear equation of a straight line graph (y=1.1793X+0.1037) shows an ideal trend line of the width of the VDP according to the copper contamination method. In FIG. 6, R2 indicates a coefficient of determination between widths of the VDP acquired by the method according to the embodiment and the linear equation.

The embodiment including steps S120 to S170 described above has a high correlativity or correlation with the copper contamination type point defect region evaluation method (R2>0.9), and has a high possibility of replacing the conventional copper contamination method.

In the embodiment, not only a wafer obtained by sawing a single crystal silicon grown by a CZ method to a predetermined thickness, removing surface damage from the silicon, and polishing the silicon but also a wafer obtained by removing only surface damage from the silicon using mixed acid etching may be introduced into the process and may be evaluated.

As a result, the point defect evaluation step may be moved up to the time immediately after ingot growth. In the embodiment, therefore, it is possible to reduce production cost and the quantity of copper used. Also, in the embodiment, no separate metal contamination for point defect evaluation is necessary, whereby it is not necessary to prepare a separate metal contamination device, and it is also not necessary to worry about contamination of the reactor (furnace) due to metal.

Figure 7:
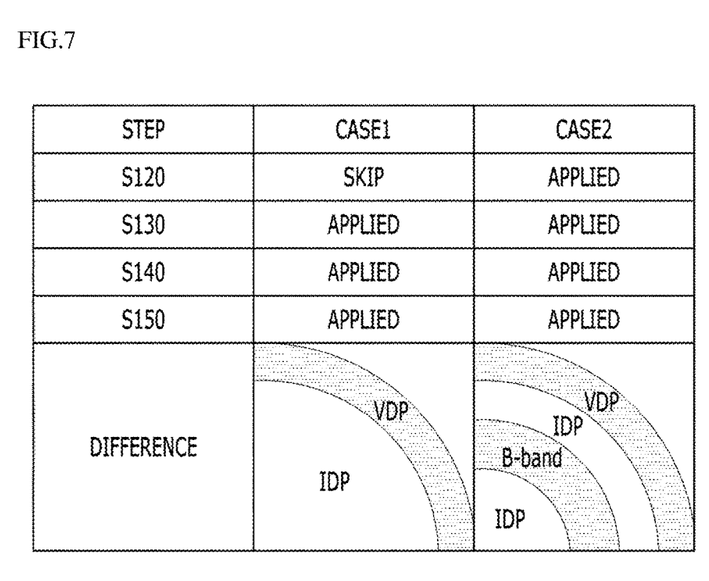
FIG. 7 shows experimental results of a first case and a second case.

FIG. 7 shows experimental results of a first case (CASE1) and a second case (CASE2).

In the first case (CASE1), the first dry oxidation process (S120) on part F of the sample wafer of FIG. 4 is omitted, and the results of execution of S130 to S170 are shown.

In the second case (CASE2), the results of execution of S120 to S170 on part F of the sample wafer of FIG. 4 according to the embodiment are shown.

In the first case (CASE1), only IDP and VDP appear. In the second case (CASE2), on the other hand, B-band appears. In the first case (CASE1), therefore, B-band cannot be recognized. In the second case (CASE2), however, B-band may be recognized in the same manner as the result of the copper contamination method of FIG. 4. In the embodiment, therefore, it is possible to rapidly and easily recognize the B-band region without copper contamination.

The features, structures, and effects described in the above embodiments are included in at least one embodiment, but are not limited only to one embodiment. Furthermore, features, structures, and effects illustrated in each embodiment may be combined or modified in other embodiments by those skilled in the art to which the embodiments pertain. Therefore, it is to be understood that such combinations and modifications fall within the scope of the present disclosure.

INDUSTRIAL APPLICABILITY

Embodiments may be used in a wafer defect region evaluation method capable of evaluating a wafer defect region by rapidly and easily discriminating between O-band, VDP, IDP, and B-band of a COP-free wafer.

The invention claimed is:

1. A wafer defect region evaluation method comprising:
preparing a sample wafer;
forming a first oxide film on the sample wafer at a temperature of 700° C. to 800° C.;
forming a second oxide film on the first oxide film at a temperature of 800° C. to 1000° C.;
forming a third oxide film on the second oxide film at a temperature of 1000° C. to 1100° C.;
forming a fourth oxide film on the third oxide film at a temperature of 1100° C. to 1200° C.;
removing the first to fourth oxide films;
etching the sample wafer, from which the first to fourth oxide films are removed, to form haze on a surface of the sample wafer; and
evaluating a defect region of the sample wafer based on the haze.

2. The wafer defect region evaluation method according to claim 1, wherein the first oxide film, the second oxide film, and the third oxide film are formed by a dry oxidation process, and the fourth oxide film is formed by a wet oxidation process.

3. The wafer defect region evaluation method according to claim 1, wherein a thickness of the second oxide film is greater than a thickness of the first oxide film, and a thickness of the fourth oxide film is greater than a thickness of each of the first to third oxide films.

4. The wafer defect region evaluation method according to claim 1, wherein
the haze comprises at least one of a white region and a black region, and
the step of evaluating the defect region of the sample wafer comprises imparting a score depending on an area of the white region or an area of the black region of the sample wafer and evaluating the defect region of the sample wafer based on the imparted score.

5. A wafer defect region evaluation method comprising:
a step of preparing a sample wafer;
a step comprising a first temperature increase period of increasing temperature to a first target temperature and a first temperature maintenance period of maintaining the first target temperature, wherein a first oxide film is formed on the sample wafer using a dry oxidation process in the first temperature maintenance period;
a step comprising a second temperature increase period of increasing temperature from the first target temperature to a second target temperature and a second temperature maintenance period of maintaining the second target temperature, wherein a second oxide film is formed on the first oxide film using a dry oxidation process in the second temperature increase period and the second temperature maintenance period;
a step comprising a third temperature increase period of increasing temperature from the second target temperature to a third target temperature and a third temperature maintenance period of maintaining the third target temperature, wherein a third oxide film is formed on the second oxide film using a dry oxidation process in the third temperature increase period and the third temperature maintenance period;
a step comprising a fourth temperature increase period of increasing temperature from the third target temperature to a fourth target temperature and a fourth temperature maintenance period of maintaining the fourth target temperature, wherein a fourth oxide film is formed on the third oxide film using a wet oxidation process in the fourth temperature maintenance period;
a step of removing the first to fourth oxide films;
a step of etching the sample wafer, from which the first to fourth oxide films are removed, to form haze on a surface of the sample wafer; and
a step of evaluating a defect region of the sample wafer based on the haze.

6. The wafer defect region evaluation method according to claim 5, wherein
the first target temperature is 750° C. to 800° C.,
the second target temperature is 850° C. to 900° C.,
the third target temperature is 950° C. to 1050° C., and
the fourth target temperature is 1100° C. to 1200° C.

7. The wafer defect region evaluation method according to claim 5, wherein each of a temperature increase gradient of the third temperature increase period and a temperature increase gradient of the fourth temperature increase period is 4[° C./min] to 6[° C./min].

8. The wafer defect region evaluation method according to claim 5, further comprising a cooling process of decreasing temperature from the fourth target temperature to a fifth target temperature between the step of forming the fourth oxide film and the step of removing the first to fourth oxide films.

9. The wafer defect region evaluation method according to claim 8, wherein the fifth target temperature is 750° C. to 850° C.

10. The wafer defect region evaluation method according to claim 8, wherein a temperature decrease gradient in the cooling process is 3[° C./min] to 10[° C./min].

* * * * *